United States Patent
De Steur et al.

(10) Patent No.: US 6,822,191 B2
(45) Date of Patent: Nov. 23, 2004

(54) METHOD FOR PRODUCING A TRENCH STRUCTURE IN A POLYMER SUBSTRATE

(75) Inventors: Hubert De Steur, Drongen (BE); Stefan Lesjak, Ettlingen (DE); Wei Pan, Zwinjnaarde Gent (BE)

(73) Assignee: Siemens Aktiengesellschaft, Munich (DE)

( * ) Notice: Subject to any disclaimer, the term of this patent is extended or adjusted under 35 U.S.C. 154(b) by 68 days.

(21) Appl. No.: 10/378,600

(22) Filed: Mar. 5, 2003

(65) Prior Publication Data

US 2003/0201258 A1 Oct. 30, 2003

(51) Int. Cl.[7] .......................... B23K 26/36; B23K 26/40
(52) U.S. Cl. .............................. 219/121.69; 219/121.76
(58) Field of Search ........................ 219/121.61, 121.68, 219/121.69, 121.76, 121.78, 121.8, 121.85; 427/554, 555; 205/125; 264/400; 29/846, 852

(56) References Cited

U.S. PATENT DOCUMENTS

| | | | |
|---|---|---|---|
| 5,173,442 A | * 12/1992 | Carey | 216/18 |
| 5,958,268 A | 9/1999 | Engelsberg et al. | |
| 6,211,485 B1 | * 4/2001 | Burgess | 219/121.7 |
| 6,492,616 B1 | * 12/2002 | Tanaka et al. | 219/121.71 |
| 2002/0033387 A1 | 3/2002 | Kurosawa et al. | |

FOREIGN PATENT DOCUMENTS

| | | |
|---|---|---|
| DE | 197 19 700 | 11/1998 |
| DE | 101 49 559 A1 | 4/2002 |
| EP | 0 164 564 | 12/1985 |
| JP | 60180687 | 9/1985 |
| JP | 08241984 | 9/1996 |
| WO | WO 98/06243 | 2/1998 |
| WO | 0016443 | 3/2000 |

OTHER PUBLICATIONS

CAD industrial Lasercutting; "CADiLAC Laser GmbH"; web: www.cadilac-laser.de.

* cited by examiner

*Primary Examiner*—Samuel M. Heinrich
(74) *Attorney, Agent, or Firm*—Harness, Dickey & Pierce, P.L.C.

(57) ABSTRACT

In order to produce a trench structure having steep sidewalls free of residues in an, in particular, glass-fiber-reinforced substrate, the substrate is provided with a conformal mask having cutouts corresponding to the trench structure to be produced. In this case, the laser beam is guided over the cutouts of the mask in such a way that the low-energy edge regions of the laser beam are shielded and that proportion of the laser beam which impinges on the polymer surface, at each point, has an energy density above a threshold at which the substrate material including a glass fiber reinforcement that is possibly present is completely removed.

26 Claims, 3 Drawing Sheets

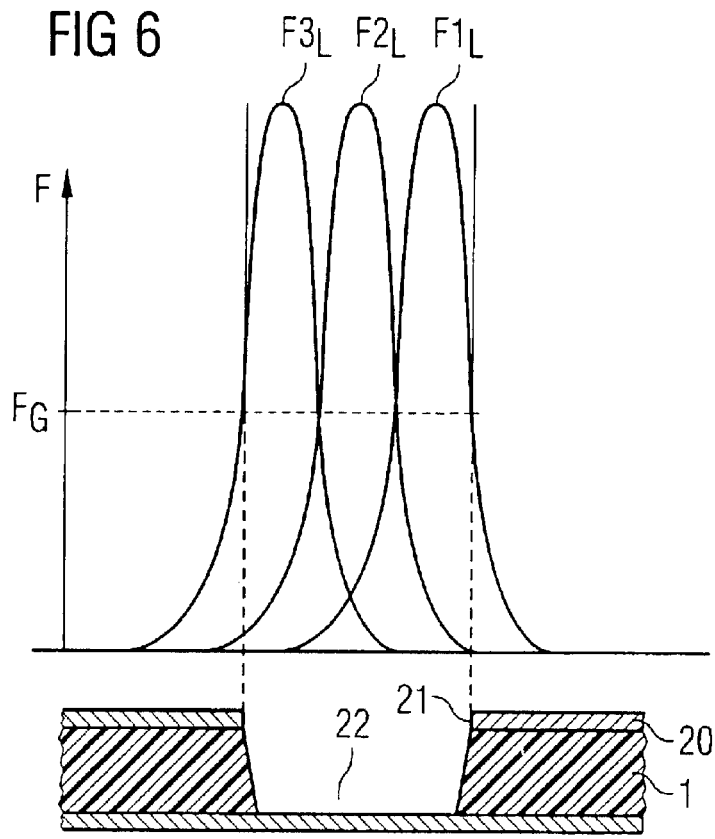
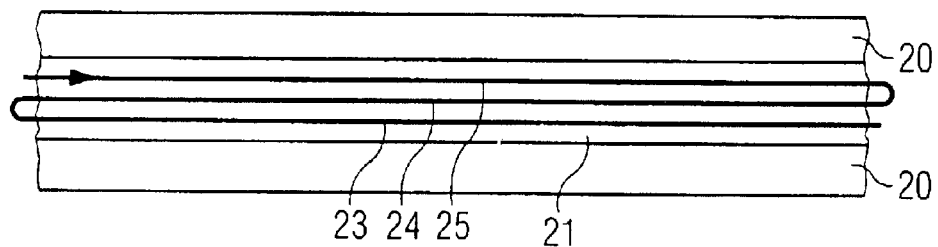
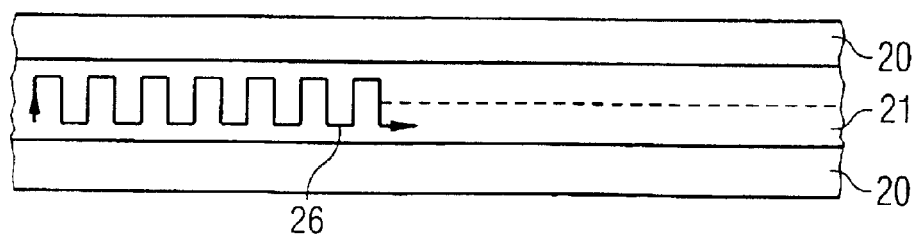

METHOD FOR PRODUCING A TRENCH STRUCTURE IN A POLYMER SUBSTRATE

The present application hereby claims priority under 35 U.S.C. § 119 on German patent application number DE 10219388.6 filed Apr. 30, 2002, the entire contents of which are hereby incorporated herein by reference.

1. Field of the Invention

The invention generally relates to a method for producing a trench structure in the surface of a polymer substrate, preferably by irradiation with a laser of a predetermined wavelength.

2. Background of the Invention

WO 00/16443 discloses the production of hole and trench structures in printed circuit boards, in which case such trench structures may serve for example for forming shielded conductor structures in the printed circuit boards. Besides plasma etching, the use of a laser is also mentioned generally therein as a device for producing such trenches in a printed circuit board.

However, when a laser radiation is employed to remove polymer material, one problem results from the fact that the energy distribution within a laser beam is not uniform, but rather follows a Gaussian distribution. Thus, a lower energy density is emitted onto a substrate in the edge regions of the laser beam than in its center. The consequence of this is that, during the fabrication of a trench structure, for instance, the sidewalls of the trench cannot be produced with the desired steepness. An additional problem arises in the case of substrates in which the polymer material is reinforced with glass fibers or the like, this reinforcement material requiring a higher energy density for removal than the polymer material itself. This has the effect that, in the edge regions of a trench fabricated in this way, the glass fibers are in part only melted but not removed and adhere to the walls in drop or ball form. Since such small glass balls cannot be removed economically either mechanically or by chemical etching, they constitute a serious problem since they disrupt the surface of the trench walls and impede a subsequent coating.

SUMMARY OF THE INVENTION

Therefore, it is an aim of an embodiment of the present invention to specify a method by which it is possible to obtain trench structures with clean sidewalls and an acceptable steepness in polymer substrates, in particular in those with glass fiber reinforcement.

According to an embodiment of the invention, this may be achieved by the following method steps:

a conformal mask made of a material which reflects the laser radiation is arranged on the surface of the substrate, which mask has cutouts corresponding to the trench structure to be produced, and the laser beam is then guided over the cutouts of the mask, said laser beam being guided at least in each case once over the boundary edge of the respective cutout in an overlapping manner such that the energy density of that proportion of the laser beam which impinges on the polymer surface, at each point, lies above a threshold at which the substrate material is completely removed.

Thus, in the case of the method according to an embodiment of the invention, with the aid of a conformal mask in each case in the edge region of the trench to be produced, that proportion of the laser beam is cropped, i.e. reflected by the mask, which would in any event not suffice to completely remove the substrate material.

An embodiment of the invention can be employed particularly advantageously when producing trench structures in a glass-fiber-reinforced substrate, the mask then shielding that edge region of the laser beam which lies below the energy threshold which is necessary for vaporizing the glass fiber material and is achieved for example in the case of a peak power density of about 1–10 MW/cm$^2$, preferably 6–7 MW/cm$^2$, depending on the material.

Preferably, a laser whose wavelength is reflected to a great extent at the mask layer, preferably comprising copper or a copper alloy, is used for producing the trench structure. In this case, the laser beam can be focused directly onto the surface of the substrate. Lasers having a wavelength of 9 $\mu$m to 11 $\mu$m are preferably used, in particular a Q-switched CO$_2$ laser having a pulse frequency of 10 to 200 kHz, preferably of approximately 100 kHz, and a pulse duration of 50 to 500 ns, preferably approximately 150 ns. However, it is also possible to use a radio-frequency-excited (RF-excited) pulsed CO$_2$ laser having a pulse frequency of between 1 and 15 kHz, preferably between 3 and 5 kHz, and a pulse duration of between 1 and 20 $\mu$s, preferably between 3 and 5 $\mu$s.

In another advantageous refinement, it is also possible to use a TEA-CO$_2$ laser (transversely excited atmospheric laser) having a pulse frequency of between 1 and 15 kHz and a pulse duration of between 50 and 100 ns, preferably about 70 ns.

Instead of the CO$_2$ laser, however, it is also possible to use other lasers. It would even be possible also to use a UV laser if such a laser is available with a sufficient power and acceptable operating speed. However, since such a UV laser, for example, is reflected only to a small extent by a mask layer made of copper, it is not permitted to be focused directly onto the plane of the mask or the substrate surface.

The mask used in the case of an embodiment of the invention is preferably a metal layer which is applied to the surface of the substrate and, as mentioned, preferably comprises copper or a copper alloy. The metal layer may be formed by chemical deposition or electrodeposition on the surface of the substrate, the cutouts then being produced by partial removal of this metal layer by chemical etching methods or mechanical separation methods.

In a particularly advantageous refinement, the mask is also formed by a patterning of the metal layer by use of a laser, a different laser being used for this than the one used for producing the trench structure in the substrate. Therefore, a laser whose wavelength is readily absorbed by the material of the mask if preferably used here; an appropriate laser for this is one having a wavelength of between 250 and 1100 nm, for example a UV laser having a wavelength of 266 or 355 nm. A solid-state laser pumped with diodes or with a flashlight lamp and having subsequent frequency multiplication may be involved in this case, which laser is operated with a pulse frequency of above 1 kHz up to 200 kHz and with a pulse duration of between 1 ns and 200 ns, preferably between 10 and 60 ns.

Depending on the width of the trenches to be produced in the substrate and depending on the spot width of the laser beam, either a single pass with the laser over the mask cutout may suffice for producing the trench structure, or the laser beam is guided in a plurality of tracks lying next to one another through the cutouts of the mask. These laser processing tracks may run in the longitudinal direction of the trenches or else be guided in meandering fashion transversely with respect to the longitudinal extent of the trenches.

The mask used according to an embodiment of the invention makes it possible, moreover, to realize a variable ratio of depth to width of the removed trenches. Generally, a ratio (aspect ratio) of 1:1 (depth=width) is expedient, but other ratios are also possible, for example 1:3 or more or 3:1 or more, in other words a wide and shallow or a narrow and deep trench being realized.

BRIEF DESCRIPTION OF THE DRAWINGS

The invention is explained in more detail below using exemplary embodiments with reference to the drawings, in which FIG. 1 diagrammatically shows the energy distribution of a laser beam and the action thereof on a trench to be produced in a substrate, FIG. 6 shows the energy distribution of a laser beam guided in a plurality of passes one next to the other for producing a wider trench in comparison with FIG. 2, FIG. 7 shows the diagrammatic illustration of the guiding of a laser beam in a plurality of longitudinal tracks, and FIG. 8 shows the diagrammatic illustration of the guiding of a laser beam in a meandering track.

DETAILED DESCRIPTION OF THE PREFERRED EMBODIMENTS

Figure 1:
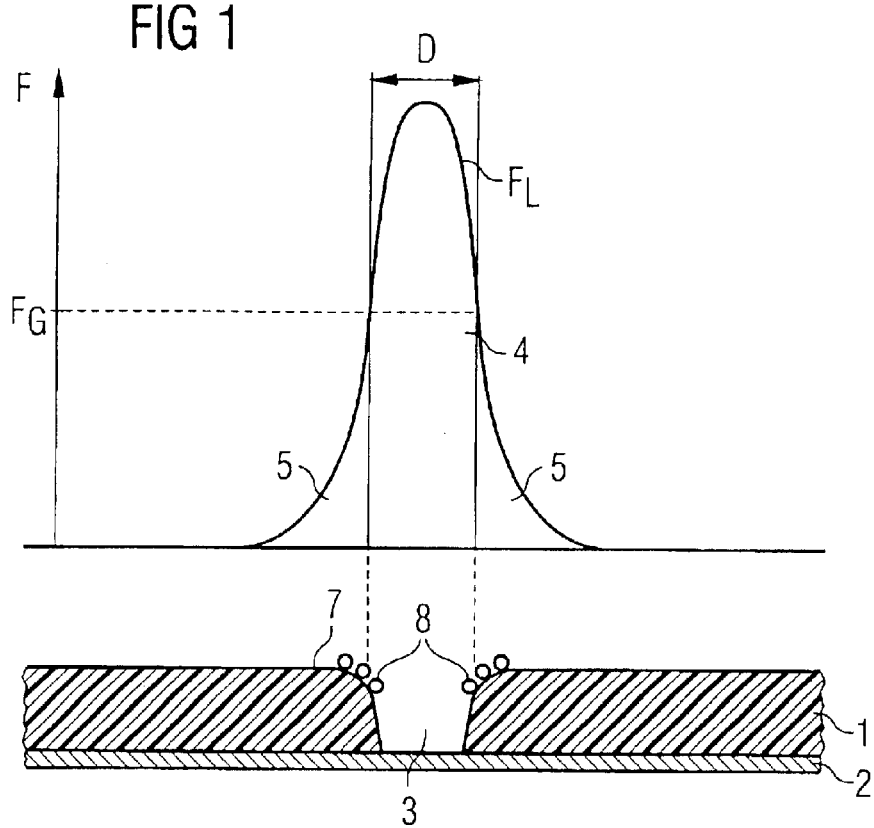

FIG. 1 generally shows the Gaussian distribution of the energy density $F_L$ of a laser beam. It can be seen in this case that only above a threshold $F_G$ does the energy density suffice to vaporize glass fibers, for instance. Therefore, in a substrate 1 with a metal layer 2 situated on the underside, a complete vaporization of the glass-fiber-reinforced substrate material for the purpose of forming a trench 3 takes place only within a central region 4 having a width D, where the energy density lies above a threshold value $F_G$. In the lateral zones 5, the energy density does not suffice for completely vaporizing the glass fiber material. Therefore, a flattened trench edge 7 is produced on which glass beads 8 (shown with their size exaggerated in the drawing) form and adhere.

Figure 2:
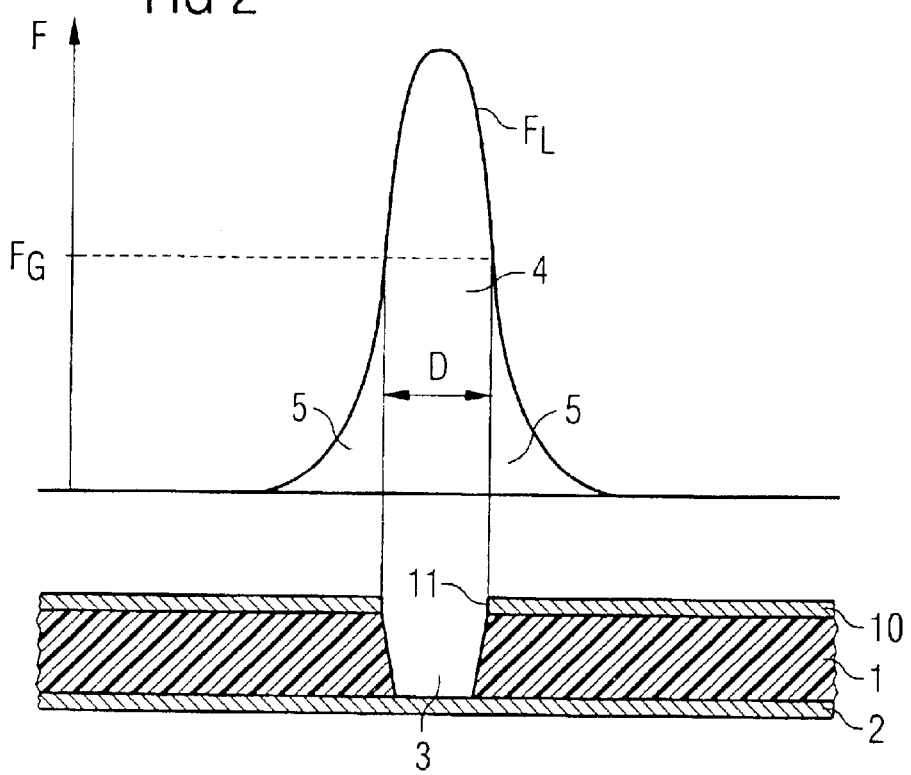
FIG. 2 shows the energy distribution of a laser beam and its action on a trench structure in a substrate according to the method according to an embodiment of the invention.

FIG. 2 shows the solution according to an embodiment of the invention for eliminating the problem described. A mask layer 10 made of copper or a copper alloy is arranged on the substrate 1, the mask layer having a cutout 11 of a size which corresponds to the desired trench 3. In this case, the trench width or the width of the cutout 11 corresponds to the width D of the central region 4 of the energy distribution $F_L$, in which the energy density lies above the threshold $F_G$. The mask 10 ensures that only this proportion of the laser energy which lies above the threshold $F_G$ reaches the substrate and, in the region of the desired trench, also completely removes the substrate together with glass fiber reinforcement.

Figure 3:
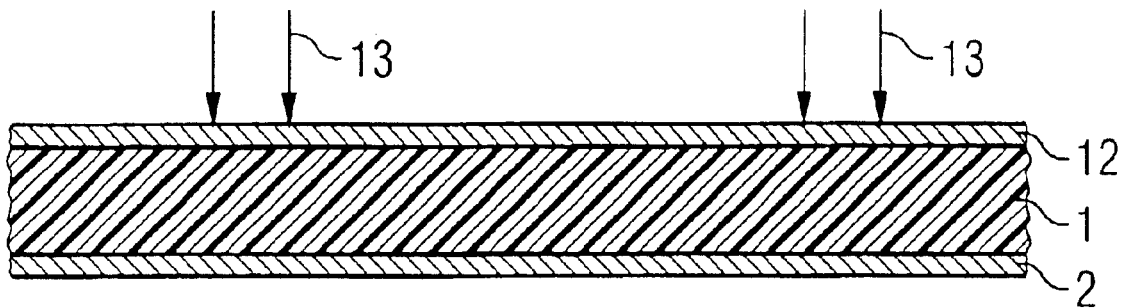
FIGS. 3, 4 and 5 show the production—according to an embodiment of the invention—of a mask and of a trench structure in successive phases of the method.
Figure 4:
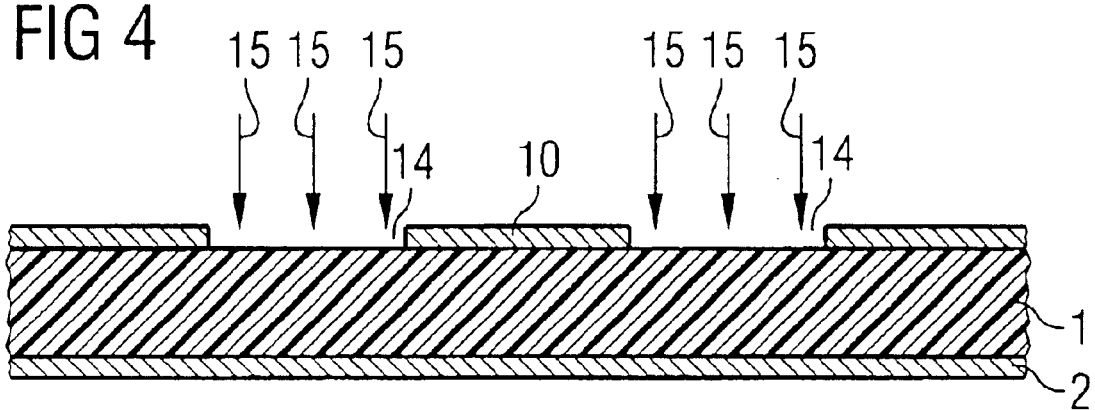
Figure 5:
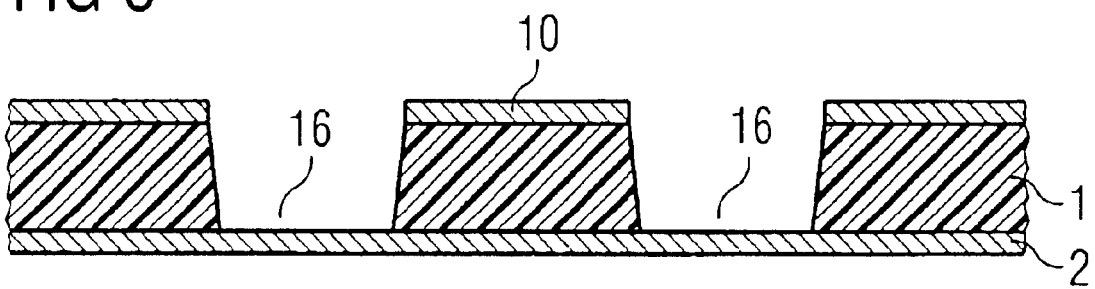

FIGS. 3 to 5 show the method sequence during the production of a mask and the subsequent production of a trench structure with two different lasers. The glass-fiber-reinforced substrate 1 is provided with the metal layer 2 on its underside and with a metal layer 12 on its top side, the mask 10 being intended to be formed from said metal layer 12. For this purpose, by use of a laser radiation 13, which is readily absorbed by the metal layer 12 on account of its wavelength, cutouts 14 are produced in accordance with a desired trench structure in the substrate 1. In this case, the laser radiation is preferably a UV laser radiation having a wavelength of 355 nm, for example. The cutouts 14 thus produced are shown in FIG. 4.

Afterward, the desired trench structure is produced by use of a laser radiation 15, preferably a $CO_2$ laser radiation of 9250 nm, by the laser beam 15 being directed through the cutouts 14 onto the substrate 1 until the trenches 16 have been produced (see FIG. 5). Depending on the width of the trenches 16 to be produced and the spot width of the laser beam used, it is necessary here, as already described previously, for the laser beam to be moved once or repeatedly through the cutouts 14. What is essential here is that the laser beam 15 is guided in each case at least once so near along the edges of the cutouts 14 that those edge regions of the laser beam whose effective energy density does not suffice for completely removing the glass-fiber-reinforced substrate material are reflected by the mask 10. Only then is it ensured that the trenches 16 in each case acquire clean walls free of glass beads with an acceptable inclination.

As mentioned, a multiple irradiation of the substrate in tracks lying next to one another is necessary in order to produce wider trenches in comparison with the spot width of the laser beam. FIG. 6 shows the superposition of the energy distribution of, for example, three laser beam tracks lying next to one another above a substrate 1 with a mask 20, which has a comparatively wide cutout 21, so that a correspondingly wide trench 22 is produced. The laser beam tracks lying next to one another in each case with the same energy distribution $F1_L$, $F2_L$ and $F3_L$ have the effect that an energy density lying above the threshold $F_G$ acts on each point of the trench to be produced.

The different laser beam tracks, for example 23, 24 and 25, may run in the longitudinal direction of the mask cutout 21 in accordance with FIG. 7. However, it is also possible for a meandering winding track 26 to be led back and forth between the edges of the cutout 21 in accordance with FIG. 8.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for producing a trench structure in the surface of a polymer substrate by irradiation with a laser, comprising the following steps:

arranging a conformal mask, made of a material which reflects the laser radiation, on the surface of the substrate, wherein the mask includes cutouts corresponding to the trench structure to be produced; and guiding the laser beam over the cutouts of the mask, said laser beam being guided at least once over the boundary edge of the respective cutouts in an overlapping manner such that an energy density of that proportion of the laser beam which impinges on the polymer surface, at each point, lies above a threshold at which the substrate material is completely removed.

2. The method as claimed in claim 1, wherein the substrate includes a glass-fiber-reinforced polymer material.

3. The method as claimed in claim 1, wherein the laser including a wavelength of between 9 and 11 $\mu m$ is used to produce the trench structure.

4. The method as claimed in claim 3, wherein a Q-switched $CO_2$ laser having a wavelength of between 9 and 11 $\mu m$, a pulse frequency of 10 to 200 kHz, preferably of approximately 100 kHz, and a pulse duration of 50 to 5000 ns, preferably of approximately 150 ns, is used.

5. The method as claimed in claim 3, wherein a radio-frequency-excited (RF-excited) pulsed $CO_2$ laser having a wavelength of between 9 and 11 μm, a pulse frequency of between 1 and 15 kHz, and a pulse duration of between 1 and 20 μs, is used.

6. The method as claimed in claim 3, wherein a TEA laser (transversely excited atmospheric laser) having a wavelength of between 9 and 11 μm, a pulse frequency of between 1 and 15 kHz and a pulse duration of between 50 and 100 ns, is used.

7. The method as claimed in claim 3, wherein the laser beam is guided in the cutouts of the mask in such a way that in each case an energy density corresponding to a peak pulse power of about 10 MW/cm$^2$ acts on each point within the cutouts.

8. The method as claimed in claim 1, wherein the mask is formed by a metal layer applied to the surface of the substrate.

9. The method as claimed in claim 8, wherein the metal layer is formed by at least one of chemical deposition and electro-deposition on the surface of the substrate, and wherein the cutouts are produced by partial removal of the metal layer by use of at least one of a chemical etching method and a mechanical separation method.

10. The method as claimed in claim 8, wherein the cutouts are produced in the metal layer by irradiation with a further laser, whose wavelength is readily absorbed by the material of the mask.

11. The method as claimed in claim 1, wherein a UV laser, pulsed with at least one of diodes and a flashlight lamp and having a pulse frequency of above 1 kHz and a pulse duration of between 1 and 200 ns, is used as a further laser.

12. The method as claimed in claim 1, wherein the laser beam for producing the trench structure is guided in a plurality of tracks through the cutouts, the tracks lying next to one another and overlapping one another such that the effective energy density at each point in the region of the cutouts lies above the threshold.

13. The method as claimed in claim 12, wherein the laser beam is guided in a plurality of tracks lying next to one another in the longitudinal direction of the trench.

14. The method as claimed in claim 12, wherein the laser beam is guided in the region of the cutouts in each case in meandering fashion transversely with respect to the longitudinal direction of the trench to be produced.

15. The method as claimed in claim 2, wherein the laser including a wavelength of between 9 and 11 μm is used to produce the trench structure.

16. The method as claimed in claim 3, wherein the laser is a $CO_2$ laser.

17. The method as claimed in claim 16, wherein the laser is a $CO_2$ laser.

18. The method as claimed in claim 3, wherein a Q-switched $CO_2$ laser having a wavelength of between 9 and 11 μm, a pulse frequency of approximately 100 kHz, and a pulse duration of approximately 150 ns, is used.

19. The method as claimed in claim 3, wherein a radio-frequency-excited (RF-excited) pulsed $CO_2$ laser having a wavelength of between 9 and 11 μm, a pulse frequency of between 3 and 5 kHz, and a pulse duration of between 3 and 5 μs, is used.

20. The method as claimed in claim 3, wherein a TEA laser (transversely excited atmospheric laser) having a wavelength of between 9 and 11 μm, a pulse frequency of between 1 and 15 kHz and a pulse duration of about 70 ns, is used.

21. The method as claimed in claim 3, wherein the laser beam is guided in the cutouts of the mask in such a way that in each case an energy density corresponding to a peak pulse power of about 6–7 MW/cm$^2$, acts on each point within the cutouts.

22. The method as claimed in claim 1, wherein the mask is formed by a metal layer made of copper or a copper alloy, applied to the surface of the substrate.

23. The method as claimed in claim 8, wherein the cutouts are produced in the metal layer by irradiation with a further laser, whose wavelength is between 250 and 1 100 nm.

24. The method as claimed in claim 1, wherein a UV laser, pulsed with at least one of diodes and a flashlight lamp and having a pulse frequency of above 1 kHz and a pulse duration of between 10 and 60 ns, is used as a further laser.

25. A method for producing a trench structure in the surface of a polymer substrate by irradiation with a laser, comprising:

guiding a beam of the laser over cutouts of a mask made of a material which reflects laser radiation, the mask being arranged on the surface of the substrate, wherein the laser beam is guided over a boundary edge of each respective cutout such that an energy density, of a proportion of the laser beam which impinges on the polymer surface, lies above a threshold at which the substrate material is completely removed.

26. The method as claimed in claim 25, wherein the substrate includes a glass-fiber-reinforced polymer material.

* * * * *